United States Patent [19]

Kohnen et al.

[11] Patent Number: 5,039,938
[45] Date of Patent: Aug. 13, 1991

[54] PHOSPHOR GLOW TESTING OF HYBRID SUBSTRATES

[75] Inventors: Kirk Kohnen, Fullerton; Robert Prohaska, Irvine, both of Calif.

[73] Assignee: Hughes Aircraft Company, Los Angeles, Calif.

[21] Appl. No.: 541,867

[22] Filed: Jun. 21, 1990

[51] Int. Cl.⁵ .......................................... G01R 31/12
[52] U.S. Cl. ............................... 324/158 F; 324/73.1; 324/158 R; 324/514
[58] Field of Search ............ 324/158 F, 158 P, 158 R, 324/158 D, 731, 500, 537, 514; 250/484.1 R, 484.1 B

[56] References Cited

U.S. PATENT DOCUMENTS

| | | | |
|---|---|---|---|
| 4,507,605 | 3/1985 | Geisel | 324/514 |
| 4,771,230 | 9/1988 | Zeh | 324/158 F |
| 4,841,242 | 6/1989 | Brunner | 324/158 R |
| 4,843,329 | 6/1989 | Beha et al. | 324/158 R |
| 4,868,492 | 9/1989 | Beha et al. | 324/158 R |

Primary Examiner—Kenneth A. Wieder
Assistant Examiner—Vinh P. Nguyen
Attorney, Agent, or Firm—Wanda K. Denson-Low

[57] ABSTRACT

An apparatus for testing hybrid substrates having a large number of networks and pads. The apparatus includes a DC power supply and a vacuum chamber. The vacuum chamber is equipped with a hot-filament electron source, and this electron source is electrically connected to the negative terminal of the DC power supply. The vacuum chamber is also equipped with a movable probe for making electrical connections from the positive terminal of the DC power supply to any one of the pads on the substrate. A small amount of phosphor of a type that glows when bombarded by electrons is placed on each pad of the substrate to be tested. The substrate is placed in the vacuum chamber for testing. The probe is brought into contact with one of the pads on the substrate, and a voltage in the order of 100 volts is applied between the electron source and the probe. Pads that are electrically connected to the probed pad act as anodes, thus attracting the electrons from the electron source, and are identified visually by the glow of the phosphor.

16 Claims, 1 Drawing Sheet

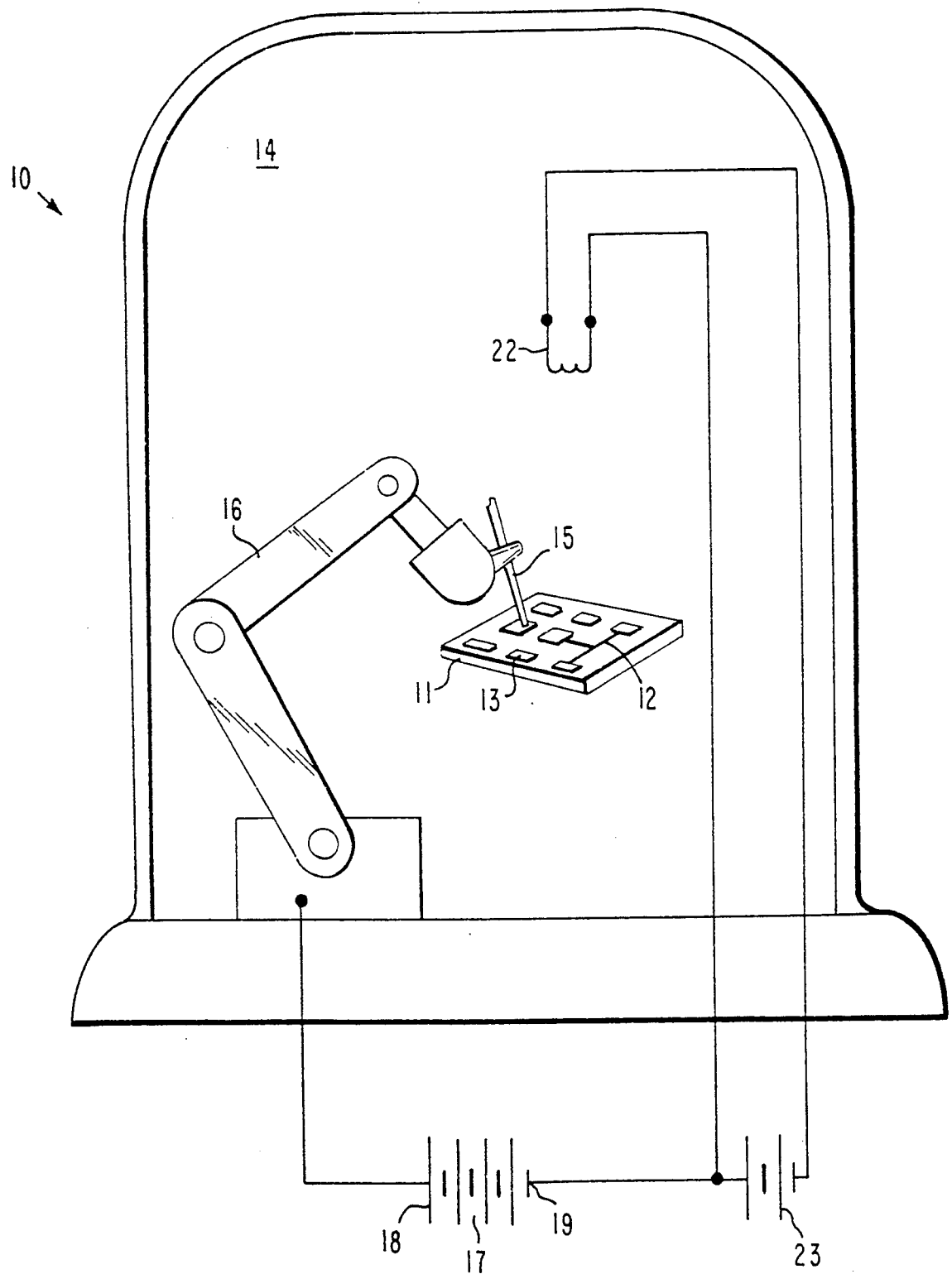

PHOSPHOR GLOW TESTING OF HYBRID SUBSTRATES

BACKGROUND

This invention relates to methods and apparatus for testing substrates of hybrid circuits, and more particularly, to a method and apparatus of testing for short circuits and for open circuits that employs electrically generated electron bombardment techniques.

Complex hybrids require that the substrates be fully tested for short and open circuits to obtain an acceptable yield. Currently it is difficult to test substrates having many networks and many bonding pads. The existing testers use two probes, one connected to each bonding pad, to test whether there is electrical connection between the pads. In order to perform a complete test to verify that there are no open connections within a network and no shorts between networks, it is necessary to probe every combination of two networks. This method of testing is very time consuming. For example, large hybrids have about 300 networks, and when testing with two probes for short circuits between each possible pair of networks, many thousands of tests must be made.

It would be highly desirable to have improved methods and apparatus for performing such tests. Accordingly, it is an objective of the present invention to provide a method for testing a plurality of interconnection networks on a hybrid substrate that can be accomplished easily and rapidly. Another objective of the invention is the provision of apparatus for detecting circuit flaws in a plurality of interconnection networks on a hybrid substrate without individually testing every possible combination of two networks. A further objective of the present invention is to provide apparatus for detecting short circuits between pairs of networks or open pads on a network by probing only once on each network.

SUMMARY OF THE INVENTION

In accordance with these and other objectives and features of the invention there is employed a testing technique in which a substrate is first prepared by placing a phosphor on each pad thereof which is adapted to glow when irradiated by electrons. This phosphor is an electrically conductive phosphor. The substrate having phosphor on its pads is placed in a vacuum chamber equipped with a movable probe and a hot filament electron source. The probe is electrically connected to the positive terminal of a DC power supply, while the negative terminal of the power supply is connected to the electron source. Electrical contact to one of the pads is made with the probe. Pads that are electrically connected to the probed pad act as anodes, thus attracting electrons from the electron source. This causes the phosphor on the pads to glow, thus providing an indication of whether the intended pads are connected to the network or are open-circuited, and whether other pads or networks are unintentionally connected by way of short-circuits.

BRIEF DESCRIPTION OF THE DRAWING

The various features and advantages of the present invention may be more readily understood with reference to the following detailed description taken in conjunction with the accompanying single drawing FIGURE, wherein like reference numerals designate like structural elements.

DETAILED DESCRIPTION

One preferred embodiment of the invention is shown in the figure. An apparatus 10 is shown with a substrate 11 in a testing position. This substrate 11 has a plurality of networks 12, and each network 12 is connected to a plurality of pads 13. A typical hybrid or high density multilevel interconnect (HDMI) substrate has many networks 12, and each network has many bonding pads 13. Substrates having up to three hundred networks 12 are not uncommon. Such complex hybrids require that the substrates be fully tested in order to obtain an acceptable yield. Prior to the present invention, testing was done with equipment using two probes, and every combination of two networks was tested to assure that there were no shorts. Such tests are very time-consuming. In accordance with the invention, a small amount of a phosphor (not shown in the drawing) is placed on each pad 13. The phosphor is one of a type that glows when bombarded by electrons. This type of phosphor is an electrically conductive phosphor. An example of such a phosphor is a type P15 phosphor available from USR Optonix Inc., Hackettstown, New Jersey, for example. A comparable phosphor is type 137 phosphor supplied by Sylvania Chemical & Metallurgical Division, Towanda, Pa. These two phosphors are comprised of zinc activated zinc oxide, denoted ZnO:Zn. The substrate 11 having such a phosphor on its pads 13 is placed inside a vacuum chamber 14 for testing.

The vacuum chamber 14 is provided with a probe 15 and means for positioning the probe 15 to make contact with any selected pad 13 on the substrate 11. One example of such a means for positioning the probe 15 is a robot arm 16 shown in the figure. The apparatus 10 includes a DC power supply 17 having a positive terminal 18 and a negative terminal 19. The probe 15 is electrically connected to the positive terminal 18 of the DC power supply 17. The negative terminal 19 of the DC power supply 17 is electrically connected to an electron source 22, which is also enclosed inside the vacuum chamber 14. In the preferred embodiment of the figure, the electron source 22 is a metal filament heated by electricity from a separate power source 23. This hot-filament electron source 22 is generally coated with rare-earth compounds to increase the efficiency of electron emission.

In operation, an electric voltage in the range from 20 to 1000 volts (typically 100 v) is applied between the probe 15 and the electron source 22 by the power supply 17. The probe 15 is placed in contact with one of the pads 13. All other pads 13 that are electrically connected to the pad 13 are also raised to a positive electrical potential and act as anodes attracting electrons from the electron source 22. Electrons reaching an anode causes the phosphor disposed thereon to glow, and the pads 13 that are electrically connected to the pad 13 are visually identifiable.

Thus there has been described a new and improved method and apparatus for testing hybrid substrates. The present invention provides for a method of testing a plurality of interconnection networks on a hybrid substrate that is accomplished easily and rapidly. The apparatus detects circuit flaws in a plurality of interconnection networks on a hybrid substrate without individually testing every possible combination of two networks. The apparatus also detects short circuits between pairs of networks or open pads on a network by probing only once on each network.

It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. Apparatus for testing a substrate having a plurality of networks disposed thereon, each network having a plurality of pads, said apparatus comprising:
   a phosphor disposed on the pads, said phosphor glowing when irradiated by electrons;
   a vacuum chamber adapted to receive the substrate having the phosphor disposed on the pads;
   a DC power supply having a positive and a negative terminal;
   an electron source disposed within the chamber and connected to the negative terminal of the DC power supply; and
   a probe disposed within the chamber and electrically connected to the positive terminal of the DC power supply, the probe being adapted to contact the pads;
   whereby electrically connecting the probe to a pad causes the probed pad to act as an anode, thereby attracting electrons from the electron source, which in turn produces a electron bombardment of all pads connected to the probed pad, which provides an indication of the pads and the networks that are connected together.

2. The apparatus according to claim 1 wherein the phosphor comprises an electrically conductive phosphor.

3. The apparatus according to claim 1 wherein the electrical networks that are short circuited to the probed pad are detected by the emission of light by the phosphor.

4. The apparatus according to claim 1 wherein the probe is movable from one pad to another while in the vacuum chamber.

5. The apparatus according to claim 1 wherein the electron source is a heated filament coated with rare earth compounds.

6. The apparatus according to claim 1 wherein the power supply provides a voltage ranging from 20 to 1000 volts.

7. The apparatus according to claim 1 wherein the phosphor is a type P15 phosphor.

8. A method of testing a substrate having a plurality of networks thereon for shorts between networks, each network comprising a plurality of interconnect pads, said method comprising the steps of:
   depositing a phosphor onto pads to be tested;
   placing the substrate to be tested in a vacuum chamber comprising a probe and an electron soruce;
   connecting the probe to the positive terminal of a DC power supply;
   connecting the electron source to the negative terminal of the DC power supply;
   connecting the probe to one of the pads; and
   activating the power supply;
   whereby the potential difference between the electron source and the probed pad causes electrons to be attracted to all the pads that are electrically connected to the probed pad, thus enabling shorted pads to be visually detectable by means of emitted light derived from electron bombardment of the phosphor.

9. The method according to claim 8 wherein the step of depositing a phosphor onto the pads comprises the step of depositing an electrically conductive phosphor onto the pads.

10. The method according to claim 8 wherein the probe is movable from one pad to another while in the vacuum chamber, and the step of connecting the probe to one of the pads further comprises sequentially connecting the probe to multiple pads on the substrate by moving the probe from one pad to another.

11. A method of testing the electrical interconnections on a substrate which comprises:
   (a) disposing a phosphor material at each location on the substrate where it is desired to test for potential interconnections; and
   (b) in a vacuum,
      providing a source of electrons; and
      applying a voltage potential between the source of electrons and one of said interconnections, the more negative voltage potential being applied to the source of electrons,
   whereby the potential difference between the electron source and said one of said interconnections causes electrons to be attracted from the electron source to each other interconnection that is electrically connected to said one of said interconnections, the resulting electron bombardment causing light to be emitted from the phosphor material at said each other interconnection.

12. The method as recited in claim 11 wherein said phosphor material is conductive.

13. A method of testing the interconnections of electrical circuits disposed on a substrate which comprises:
   (a) disposing a phosphor material at each location on the electrical circuits where it is desired to test for interconnections; and
   (b) in a vacuum
      providing a source of electrons; and
      applying a voltage potential between the source of electrons and one of said locations, the more negative voltage potential being applied to the source of electrons,
   whereby the potential difference between the electron source and said one of said locations causes electrons to be attracted from the electron source to each other location that is electrically connected to said one of said locations, the resulting electron bombardment causing light to be emitted from the phosphor material at said each other location that is electrically connected to said one of said locations.

14. The method as recited in claim 13 wherein said phosphor material is conductive.

15. A method of testing the interconnections of an electrical circuit disposed on a substrate with a predetermined location in said electrical circuit which comprises:
   (a) disposing a phosphor material at each location on the electrical circuits where it is desired to test for interconnection with said predetermined location; and
   (b) in a vacuum,
      providing a source of electrons; and
      applying a voltage potential between the source of electrons and said predetermined location, the more negative voltage potential being applied to the source of electrons, whereby the potential difference between the electron source and predetermined location causes electrons to be attracted from the electron source to each other location that is electrically connected to said predetermined location, the resulting electron bombardment causing light to be emitted from the phosphor at said each other location that is electrically connected to said predetermined location.

16. The method as recited in claim 15 wherein said phosphor material is conductive.

* * * * *